United States Patent [19]
Woodruff et al.

[11] Patent Number: 5,510,998
[45] Date of Patent: Apr. 23, 1996

[54] SYSTEM AND METHOD FOR GENERATING COMPONENT MODELS

[75] Inventors: Kenneth P. Woodruff, Santa Cruz; Alokkumar B. Agarwal, Santa Clara, both of Calif.; Natan Dunsky, Kefar-Save, Israel; Eric J. Van Dyke, Aromas, Calif.; Vijay C. Madhavan, Sunnyvale, Calif.; Elizabeth R. McCanlies, Aptos, Calif.

[73] Assignee: Cadence Design Systems, Inc., San Jose, Calif.

[21] Appl. No.: 259,027

[22] Filed: Jun. 13, 1994

[51] Int. Cl.$^6$ .................................................. G06F 17/50
[52] U.S. Cl. ........................................... 364/489; 364/488
[58] Field of Search ................................. 364/488, 489, 364/490, 491, 578

[56] References Cited

U.S. PATENT DOCUMENTS

| | | | |
|---|---|---|---|
| 4,924,385 | 5/1990 | Dote | 364/300 |
| 4,937,755 | 6/1990 | Yokota et al. | 364/488 |
| 5,038,294 | 8/1991 | Arakawa et al. | 364/491 |
| 5,164,911 | 11/1992 | Juran et al. | 364/578 |
| 5,175,696 | 12/1992 | Hooper et al. | 364/489 |
| 5,249,133 | 9/1993 | Batra | 364/489 |
| 5,249,265 | 9/1993 | Liang | 395/160 |
| 5,262,959 | 11/1993 | Chkoreff | 364/489 |
| 5,349,539 | 9/1994 | Moriyasu | 364/578 |

FOREIGN PATENT DOCUMENTS

| | | | |
|---|---|---|---|
| 0267379 | 8/1987 | European Pat. Off. | G06F 15/60 |

OTHER PUBLICATIONS

S. Foo et al., "Databases and Cell-Selection Algorithms for VLSI Cell Libraries", Computer, pp. 18–30, Feb. 23, 1990, No. 2. Los Alamitos, CA.

A. Hekmatpour et al., "Hierarchical Modeling of the VLSI Design Process", IEEE Expert, pp. 56–70, Apr. 6, 1991, No. 2. Los Alamitos, CA.

"Automatic Generation of Digital System Schematic Diagrams" by Arya et al, IEEE 22nd Design Automation Conference, 1985, pp. 388–394.

"Methods Used in an Automatic Logic Design Generator (ALERT)" by Friedman et al, IEEE Trans. on Computers, vol. C–18, No. 7, Jul. 1969, pp. 593–614.

"Cell Libraries and Assembly Tools for Analog/Digital CMOS and BiCMOS ApplicationSpecific Integrated Circuit Design" by Smith et al, IEEE Solid–State Circuits, Oct. 1989, pp. 1419–1432.

*Primary Examiner*—Vincent N. Trans
*Attorney, Agent, or Firm*—John T. McNelis

[57] ABSTRACT

An electrical component model generator generates, stores, and retrieves component models in a component model library. Component models comprise property values. A property value quantifies a property. Properties are associated with a plurality of component models. The component model generator generates rules. A rule is a relationship between two or more properties. A rule applied to two or more properties associated with the component model define a property value for at least one of these properties. Properties that are not defined by rules or that have a value different from the value generated by a rule are quantified by an exception value that is input by a user. The component model generator stores the component models by storing the rules for all component models and the exception values for each component model. Generating and maintaining the component model library is facilitated by automatically applying the rules to the component model to generate some or most of the property values. A user does not need to manually input these values. As a result, user input time and data entry errors are reduced.

12 Claims, 8 Drawing Sheets

5,510,998

SYSTEM AND METHOD FOR GENERATING COMPONENT MODELS

FIELD OF THE INVENTION

The invention relates generally to the field of information handling systems, particularly to generating, storing, and retrieving electronic component models using rules and exceptions.

BACKGROUND OF THE INVENTION

Designing a circuit in a computer aided design (CAD) environment often requires a component library. The component library facilitates the design process by providing a database of information that defines many properties of components. These components are frequently used when designing circuits. Examples of components include resistors and AND gates. Examples of component properties include pin separation distance, input voltage, and output voltage.

Currently, component libraries require a large amount of storage space, e.g., twenty gigabytes. The storage requirements are a result of the component library directly storing every property value for every component. A significant cost is required to store, modify, and deliver such libraries. For example, shipping such data from a vendor to a customer can require forty compact disk read only memories (CD-ROMs), each storing approximately 600 megabytes.

Another problem with such a large database is the probability of data entry errors. A user must manually enter a value for each property of every component model when creating a component library using current component generators. A component library can consist of thousands of component models. Each component model can have hundreds of properties. Therefore, there is a significant probability that a user will assign an improper value to some of the component properties.

Another problem with current systems and methods for creating component libraries is that a significant time investment is involved in creating and maintaining the component library. The annual time commitment for creating and maintaining a twenty gigabyte library can be several man-years.

It is therefore desirable to provide a system and method for reducing the storage requirements of a component library while reducing the probability of data entry errors, and while reducing the time required for creating and maintaining the component property values.

SUMMARY OF THE INVENTION

The invention is a system and method for generating, storing and retrieving component models. The invention resides in creating a rule based component library. The component library contains many component models. Each component model has many properties. A particular property is often a characteristic of many component models. Associated with each property in a given component model is a property value. Frequently, the property value for a particular component model is the same as the property value for many other component models.

Instead of storing each property value, as is currently done, the invention stores rules and exceptions. A rule defines a value for a particular property based on the value of one or more additional properties of the given component model. It is possible for a rule to assign an incorrect value to a property for a particular component. If this occurs, the correct value is input by a user. This user input value is called an exception value. The exception value is stored in the component library. To ensure accuracy when retrieving property values for a given component, the exception value has priority over all rule defined property values (rule-based values). Storing components in a component library includes storing a set of rules common to all components in addition to the name of each component, a pointer identifying the properties of each component, and the exception values of each component. As a result, the invention significantly reduces the storage requirements for a component library.

Another feature of the invention is that the time required to create and modify the component library significantly decreases. Many property values are automatically defined by applying the rules to one or more previously determined property values of a component. If correct, such property values need not be manually entered. Automatically defining property values also reduces the probability of data entry errors because the amount of manually entered data is significantly reduced when compared to previous systems.

DETAILED DESCRIPTION OF THE PREFERRED EMBODIMENTS

A preferred embodiment of the present invention is now described with reference to the Figures where like reference numbers indicate identical or functionally similar elements. Also in the Figures, the left most digit of each reference number corresponds to the Figure in which the reference number is first used.

The invention is directed to a component model generator having a number of innovative features, for example the component model generator defines rules associated with two or more properties of component models. Each rule defines a property value based on one or more additional property values of the component model. Storing a component model using the invention requires less memory than previous systems because only certain property values (exception values) are stored for each component model, instead of storing all property values. Property values that are not exception values are automatically generated using the rules.

Figure 1:
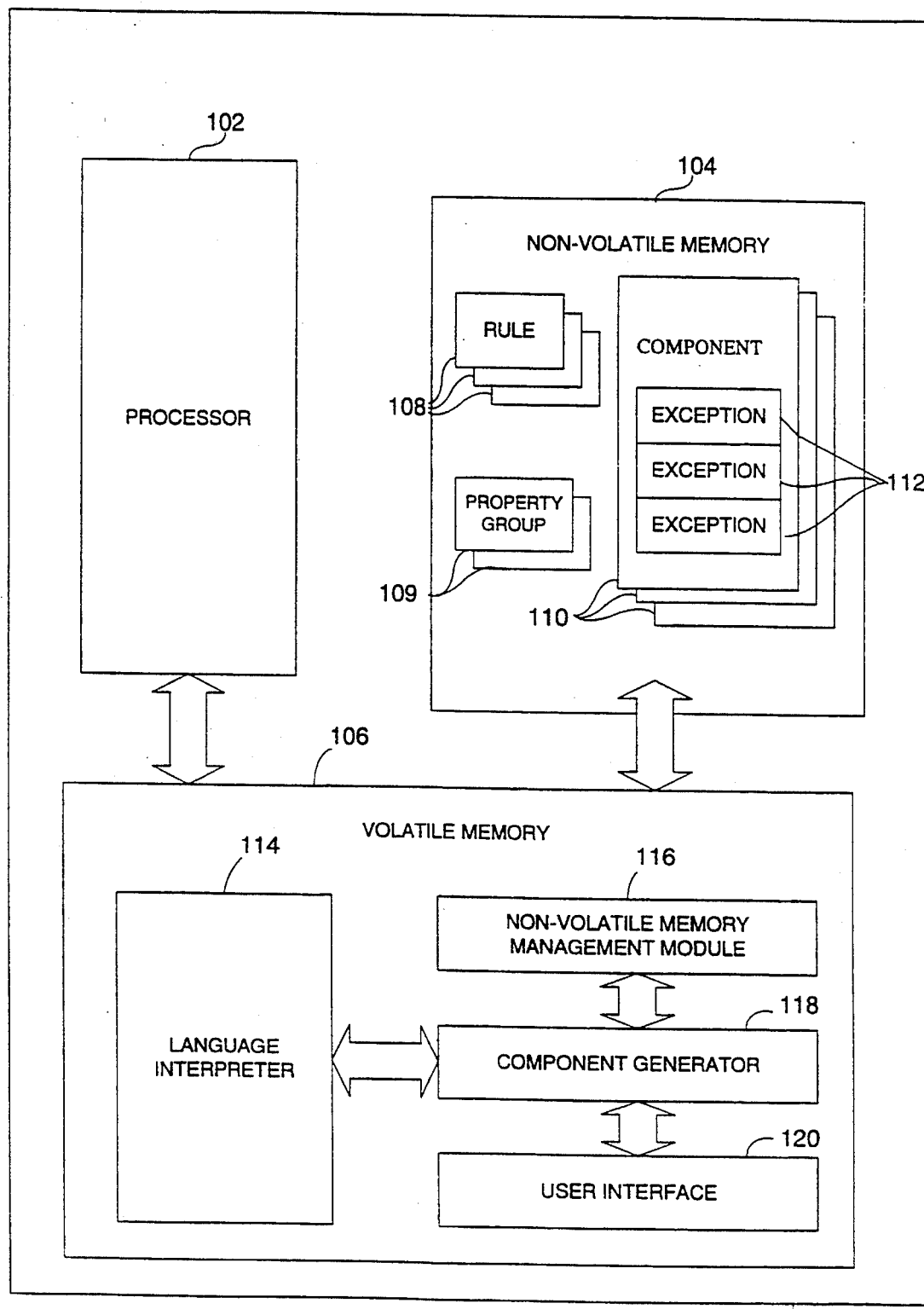
FIG. 1 is an illustration of an environment in which the preferred embodiment of the invention resides.

FIG. 1 illustrates one embodiment of the present invention that includes a processor 102 and memory 104, 106. In the preferred embodiment non-volatile memory 104 and volatile memory 106 are used. A plurality of rules 108, property lists 109 and component models 110 are stored within the non-volatile memory 104. Each rule 108 defines a relationship between two or more properties. A property is a feature or attribute unique to a specific component model or common to a plurality of component models. Each component model is associated with a group of properties 109. Within a component model each associated property has a value. If this value is not determinable from a rule 108 then this value is stored with the component model 110 as an exception value 112 or is not stored and has a null value.

Within the volatile memory 106 are four major modules. A language interpreter 114 interprets the rules 108. A non-volatile memory management module 116 retrieves information from and stores information to the non-volatile memory 104. A component generator 118 creates the component models. A user interface 120 enables a user to interact with the component model generator 100. A more detailed description of each of these modules is set forth below.

Figure 2:
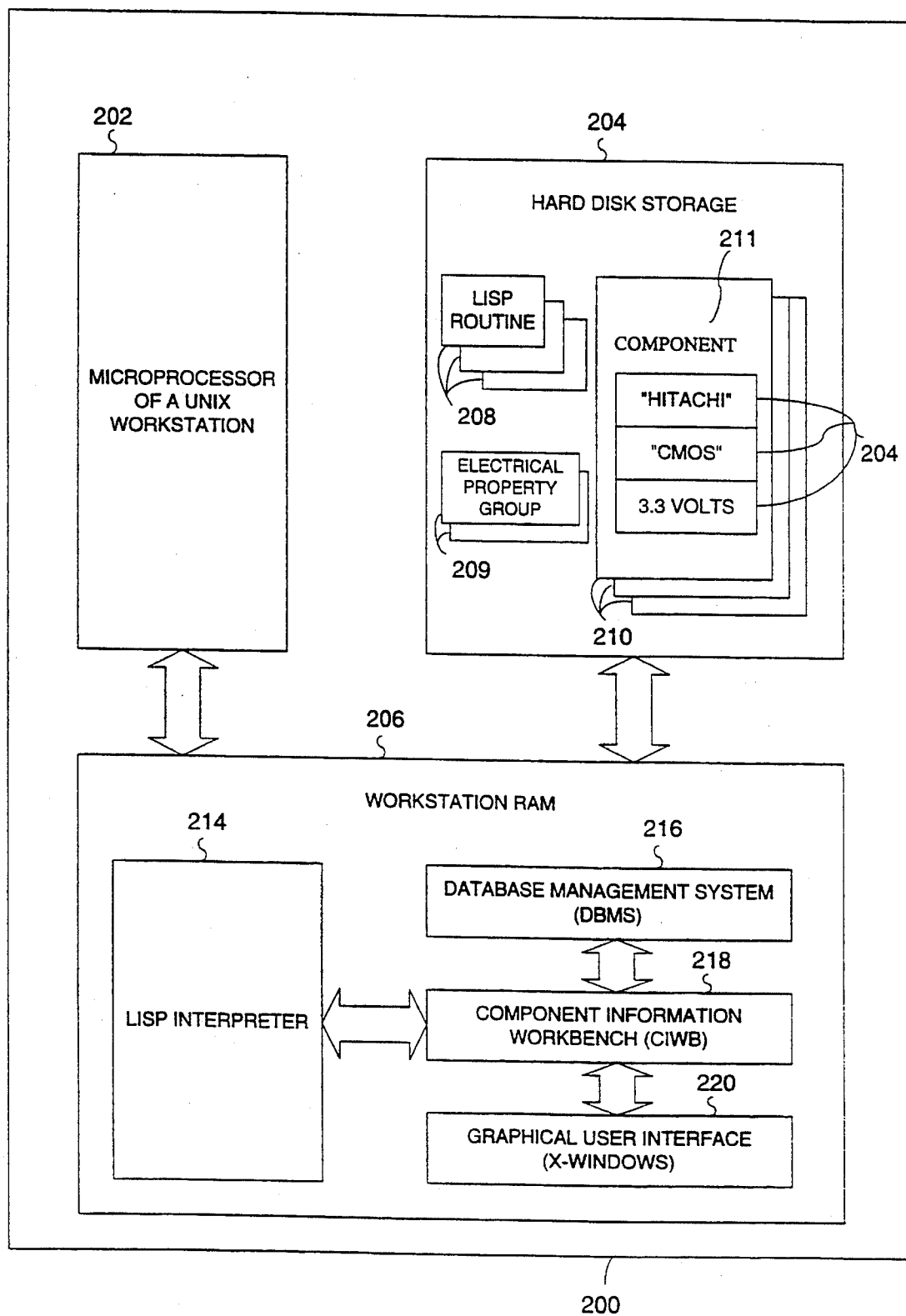
FIG. 2 is a more detailed illustration of an environment is which the preferred embodiment resides.

FIG. 2 illustrates a more detailed environment in which the preferred embodiment of the invention resides. In the preferred embodiment the processor 102 is a microprocessor of a UNIX workstation 202. The non-volatile memory 104 is a hard disk storage device 204. In the preferred embodiment the microprocessor 202 does not directly communicate with the hard disk storage 204. However, in alternative embodiments, the hard disk storage 204 is coupled directly to the microprocessor 202. Rules 108 are stored within the hard disk storage 204 as List Processing (LISP) language routines 208. Property groups 109 are stored as sub-groups, sub-lists, or views of properties, e.g., an electrical property group 209. Component models 210 are stored within the hard disk storage 204 as a component name 211 and a list of exception values 212. The volatile memory 106 is a workstation random access memory (RAM) 206. The language interpreter 114 is a LISP interpreter 214. A database management system (DBMS) 216 such as "ObjectStore" from Object Design, Inc., Burlington Mass., is used as the non-volatile memory management module 116. A graphical user interface (GUI) 220, such as X-windows, from the Massachusetts Institute of Technology (MIT), is used as the user interface 120. In the preferred embodiment, the component generator 118 is the component information workbench (CIWB) 218. The CIWB 218 is described in greater detail below with reference to FIG. 3.

Figure 3:
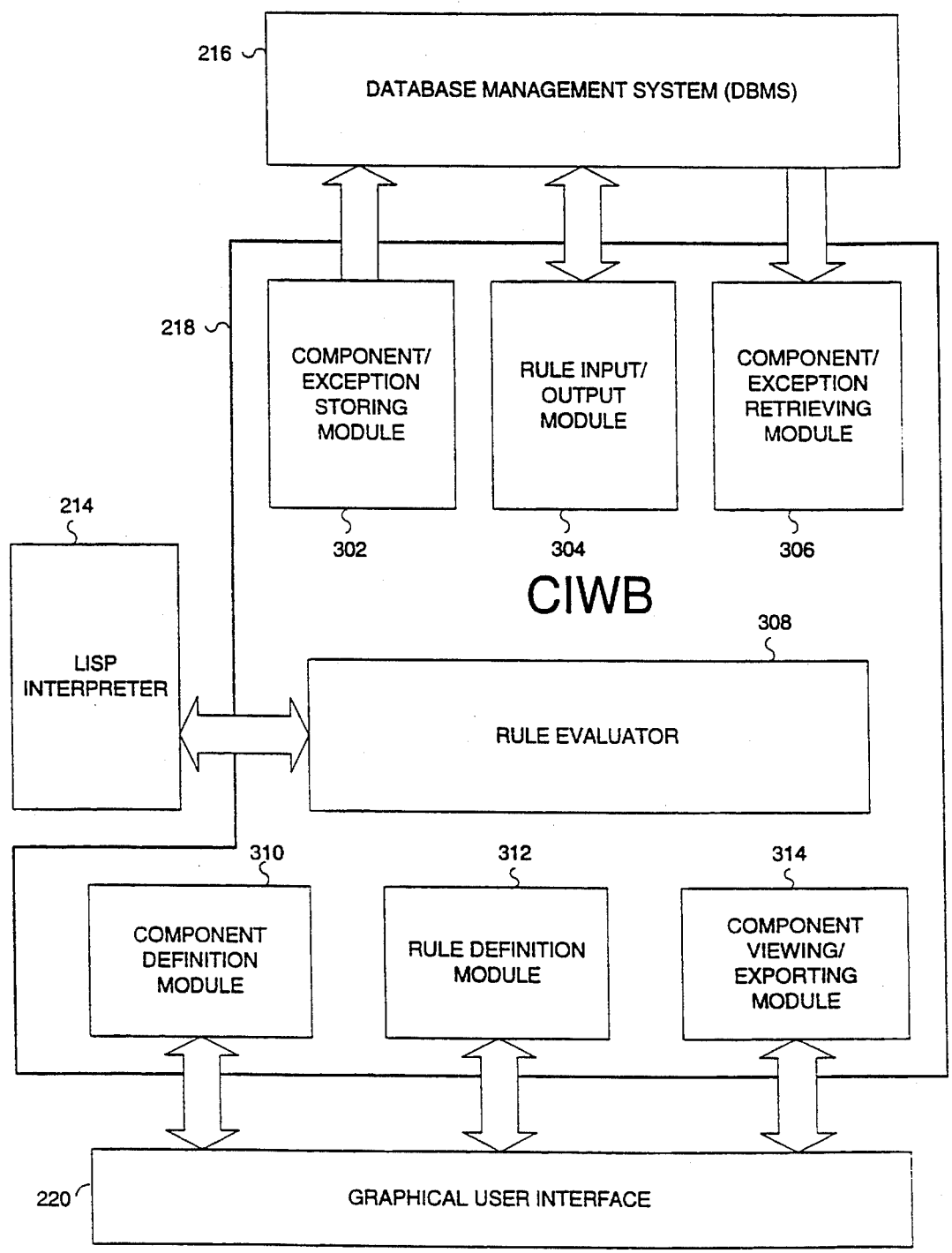
FIG. 3 is a more detailed illustration of the component information workbench of FIG. 2.

FIG. 3 is a detailed illustration of the CIWB 218 of the present invention. A detailed description of the functions performed by the modules 302–314 is given below with respect to the descriptions of FIGS. 4–7. A component/exception storing module 302 communicates with the DBMS 216 to store component models 210 on the hard disk storage 204. A rule input/output module 304 communicates with the DBMS 216 to receive rules from and to store rules in the hard disk storage 204. A component exception retrieving module 306 communicates with the DBMS 216 to retrieve component models 210 from the hard disk storage 204. A rule evaluator 308 receives a component model 210 and the rules 208. The rule evaluator 308 then communicates with the LISP interpreter 214 and evaluates the rules 208 to define property values for the component model 210.

A component definition module 310 communicates with the GUI 220 to enable a user to define and edit the property values, including the exception values 212, of each component model 210. A rule definition module 312 communicates with the GUI 220 or with a text editor (not shown) to enable a user to define and edit rules. A component viewing/exporting module 314 exports component model information outside the CIWB 218, e.g., to export information to an application specific integrated circuit (ASIC) design system. A feature of the preferred embodiment is that the component viewing/exporting module 314 does not distinguish between component property values derived from rules 208 and component property values defined by exception values 212. The result is that the component viewing/exporting module 314 is an interface that is independent of the techniques used to derive the property values for each component model 210. Therefore, the present invention obviates any incompatibility between the component model generator 200 and devices retrieving information from the design library, e.g., an ASIC design system.

Figure 4:
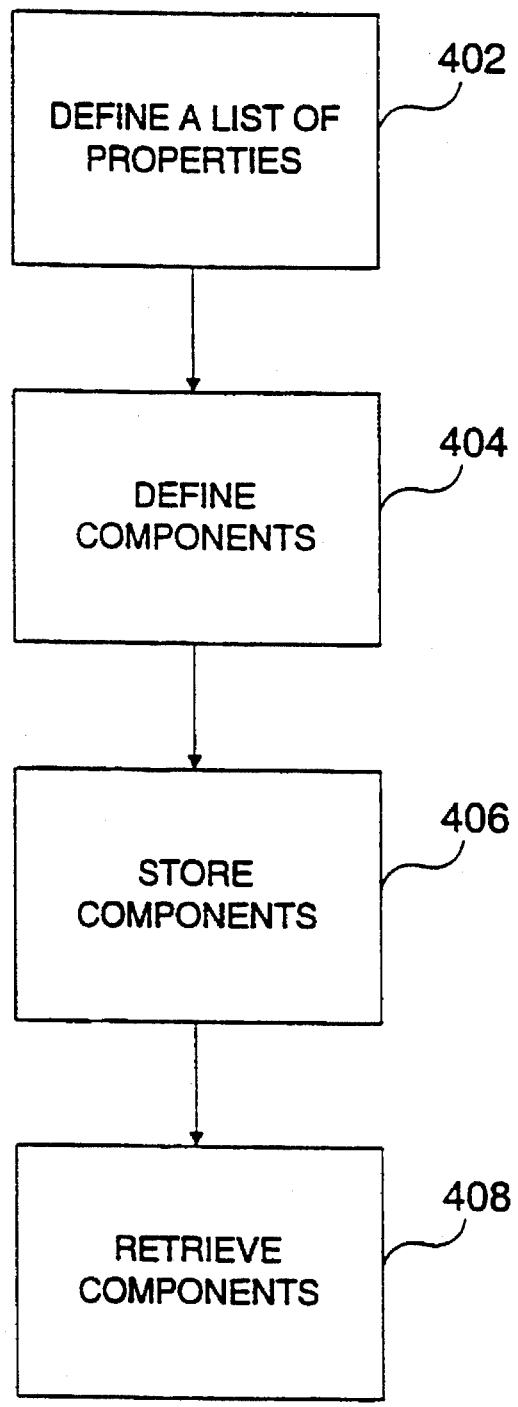
FIG. 4 is a flow diagram showing the general method of a preferred embodiment of the invention.

FIGS. 4 through 7 are flow diagrams illustrating the method of the present invention. FIG. 4 is a flow diagram illustrating the general method of a preferred embodiment of the invention. A purpose of the invention is to create and efficiently store component models 210. A component is a device used in the manufacture of an electrical or electronic system, or any representation thereof. That is, a component is not limited to hardware. A software representation of a device is also considered a component. Examples of components are: digital integrated circuits (e.g., microprocessors), memory, digital signal processors, analog integrated circuits, discrete devices (e.g., resistors, capacitors), connectors, sockets, logic gates, and representations of any of the above, e.g., software representations.

A component model 210 is a representation of a component that comprises a plurality of properties. A user defines, 402, a list of properties. A property is any feature or attribute unique to a given component model 210 or common to a plurality of component models 210. An example of a property is the voltage necessary to operate a component. This property can be called "required voltage." Many component models 210 have this "required voltage" property, but the property value can vary between component models 210. A property value is a number, measurement, description, or other quantifier that accurately describes a property of a given component model 210. For example, the property value for the property "required voltage" is "3.3 Volts" for a low power memory chip while it is "5.0 volts" for a standard memory chip.

The list of properties may be subdivided into sub-lists, groups or views. Each group of properties may contain properties relevant to the needs of a particular user. For example, a corporate librarian may be interested in properties related to ordering information, e.g., part number, cost, manufacturer. These properties can be grouped into one "view" or sub-list to enable the user to more efficiently view, modify, or define the properties. A design engineer may be interested in entirely different properties, such as input voltage, and current rating. Such information can be grouped into a different "view" or sublist for ease of use.

After a list of properties is defined, 402, the component models 210 are defined, 404. A detailed description of the method for defining component models 404 is given below with reference to FIGS. 5A and 5B. After the component models are defined, they can be efficiently stored into memory, 406. A detailed description of the method for storing component models is given below with reference to FIG. 6. After the component models are stored, they can be retrieved and regenerated, 408. A detailed description of the method for retrieving component models is given below with reference to FIG. 7.

Figure 5A:
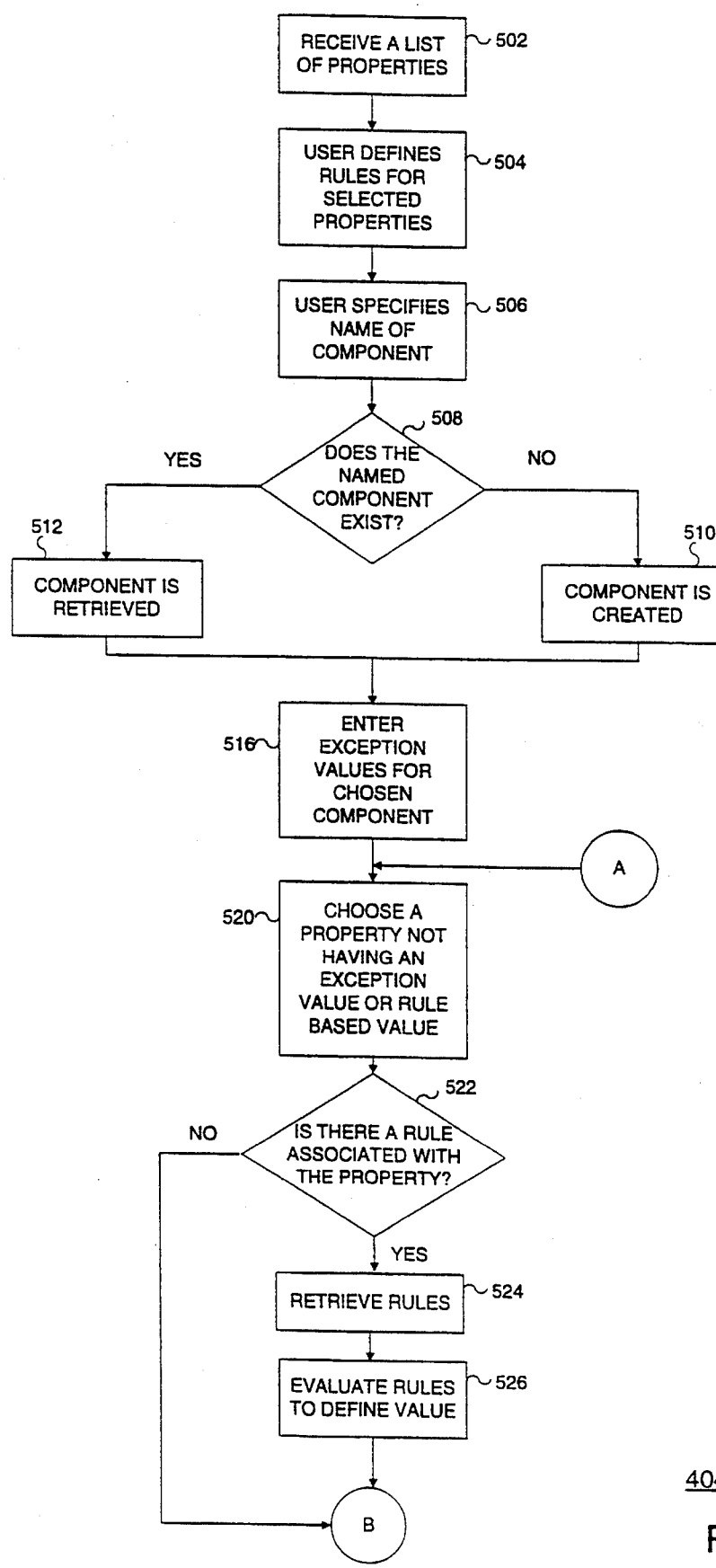
FIGS. 5A–B comprise a flow diagram showing a technique for defining component models according to a preferred embodiment of the invention.
Figure 5B:
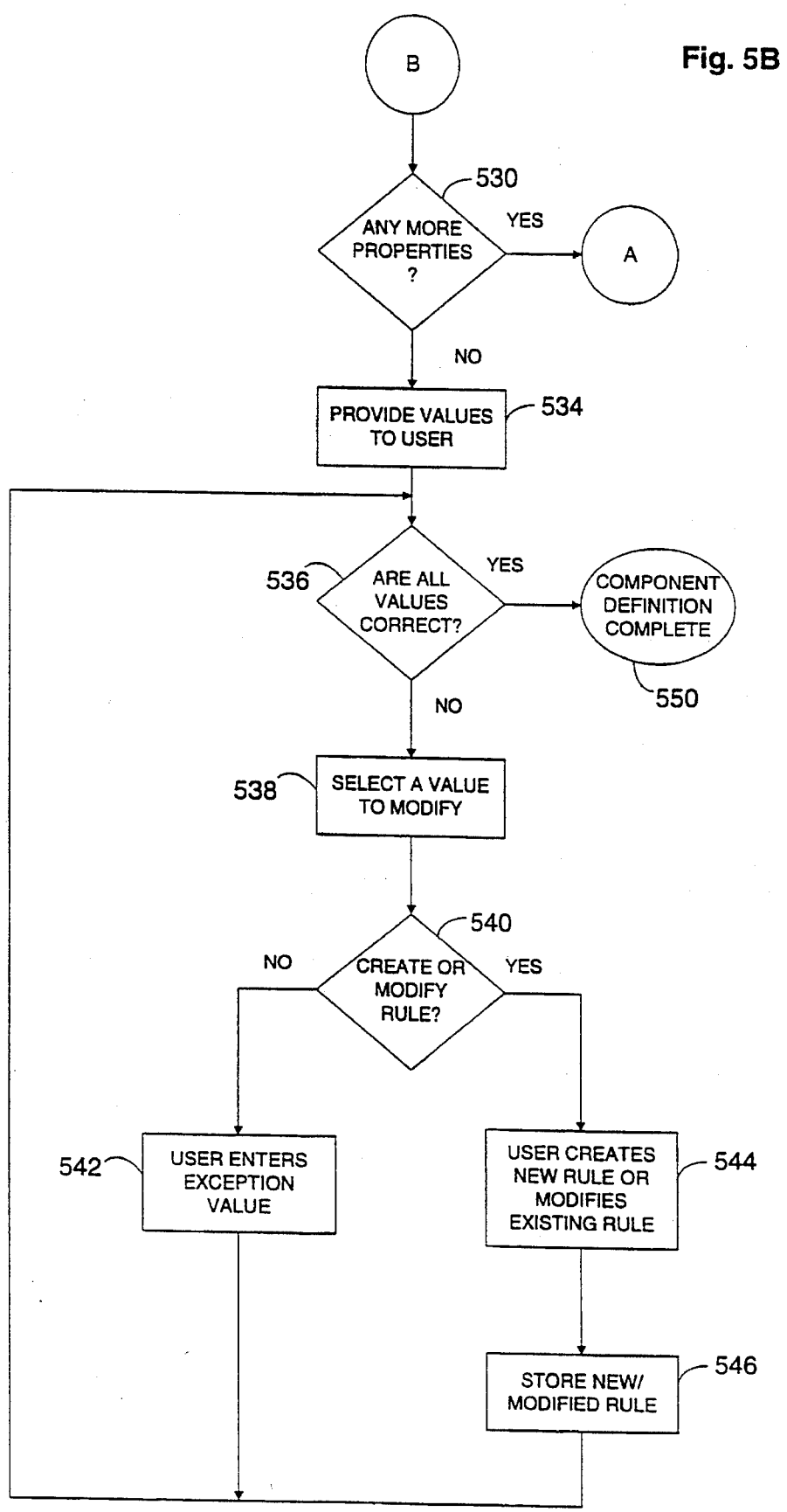

FIGS. 5A–B are flow diagrams illustrating a technique for defining, 402, component models according to a preferred embodiment of the invention. The component definition module 310 receives, 502, a list of properties that are necessary to define the component model. As stated above, the list of properties can be a subset of a larger property list, defined in step 402. A user defines, 504, rules for selected properties within the list of properties. A rule is a relationship between two or more properties that defines a value for one or more properties based on the values of one or more different properties within a given component model. In the preferred embodiment, a rule is a relationship described in a programming language, e.g., LISP, and associated with a property. When the rule evaluator 308 applies a rule to an associated property of a component model, the rule evaluator 308 generates a value for the associated property based upon one or more additional properties of the given component model.

In the preferred embodiment, the user creates rules using a GUI 220 or a text editor (not shown). The rules are generally of the form of an "IF..THEN" programming language statement or of an "IF..THEN..ELSE" programming language statement. For example, if two property names are "VOLTAGE_IN_LOW" and "TECHNOLOGY" a simple rule may have the form shown in equation (1).

if TECHNOLOGY='TTL' then VOLTAGE_IN_LOW=-350 mv    (Eq. 1)

If the value for the TECHNOLOGY property of a component is "TTL" then the VOLTAGE_IN_LOW property value is -350 millivolts (mv). A more complex rule using the previous two properties and a third property, "MANUFACTURER" may have the form shown in equation (2).

if TECHNOLOGY =                                    (Eq. 2)
    'TTL' then VOLTAGE_IN_LOW = -350 mv
else if TECHNOLOGY = 'ECL' and
    MANUFACTURER = 'TI', then
    VOLTAGE_IN_LOW = -450 mv
else if TECHNOLOGY = 'ECL'
    then VOLTAGE_IN_LOW = -500 mv In equation (2), the VOLTAGE_IN_LOW value for a component model is equal to -450 mv if the TECHNOLOGY value for the component model is equal to "ECL" and the MANUFACTURER value for the component model is equal to "TI".

The user specifies 506 the name of the component model to be defined. The name can be any unique identification. The name facilitates the storing and retrieving of the component model from the hard disk storage 204. The component definition module 310 determines if the named component model currently exists in a component model library. If the component model exists, the component model is retrieved, 512, from the hard disk storage 204. The technique for retrieving the component model is described in detail below with reference to FIG. 7. Once retrieved, the component model may be modified as later described herein.

If the component definition module 310 determines that the named component model does not exist, the component model is created, 510. Component model creation comprises associating the component model name with the list of properties defined in step 504. The user defines, 516, the property values for one or more properties associated with the component model. Certain properties are difficult to derive using rules, e.g., manufacturer, packaging type. Frequently, the user enters values for these properties, thus providing a "seed" to be used in conjunction with the rules in determining other property values for the component model. These "seed" values are called exception values. An exception value is a property value input by a user. There are three types of property values, namely: those derived by rules (rule-based values); those entered by the user (exception values); and null values, i.e., an unquantified property value.

The component definition module 310 chooses, 520, a property, not having an exception value or a rule based value, that is associated with the component model. The component definition module 310 determines, 522, if any rules are associated with the property. If there is at least one rule associated with the property, the rule input/output module 304 retrieves, 524, the rules. The rule evaluator 308 evaluates, 526, each rule associated with the property. Since more than one rule can be associated with a particular property, the rule definition module 312 assigns a priority to each rule. Therefore, if two rules apply to a single property and the conditions for each rule are satisfied, the rule evaluator 308 evaluates the rules and defines the property value based upon higher priority rule.

If the component definition module 310 determines, 522, that no rules are associated with the property then the component definition module 310 determines, 530, if any additional component properties: (1) do not have a value; and (2) have not been previously chosen, 520. If such a property exists, steps 520 through 530 are repeated until all properties not associated with a value have been chosen, 520. The component definition module 310 assigns a null property value to those properties that have not otherwise been assigned a value.

The component definition module 310 provides, 534 the values for all of the component properties to the user via the GUI 220. The user determines, 536, if all of the property values are correct. If all of the values are not correct the user selects, 538, a property value to modify. The user proceeds, 540, in one of two paths. In the first path the user enters an exception value, 542, for the property. As stated above, the property value is an exception value because it is provided by the user and is not defined by a rule. In the second path, the user either creates, 544, a new rule or modifies an existing rule. The process for creating a new rule is described above. The rule modification process is similar to the rule creation process except that, instead of completely defining a new rule, the user modifies an existing rule on the GUI 220 or on a text editor (not shown). An example of a text editor which can be used to create or modify rules is the "vi" editor which is a standard text editor for the UNIX operating system. In general, the user should enter an exception value, step 542, when a unique component is being modeled. If the property value is common among two or more component models, the user should either create or modify a rule. Steps 536–546 are repeated until the user determines that all values for the component model are correct. The component model definition process is then complete 550.

Figure 6:
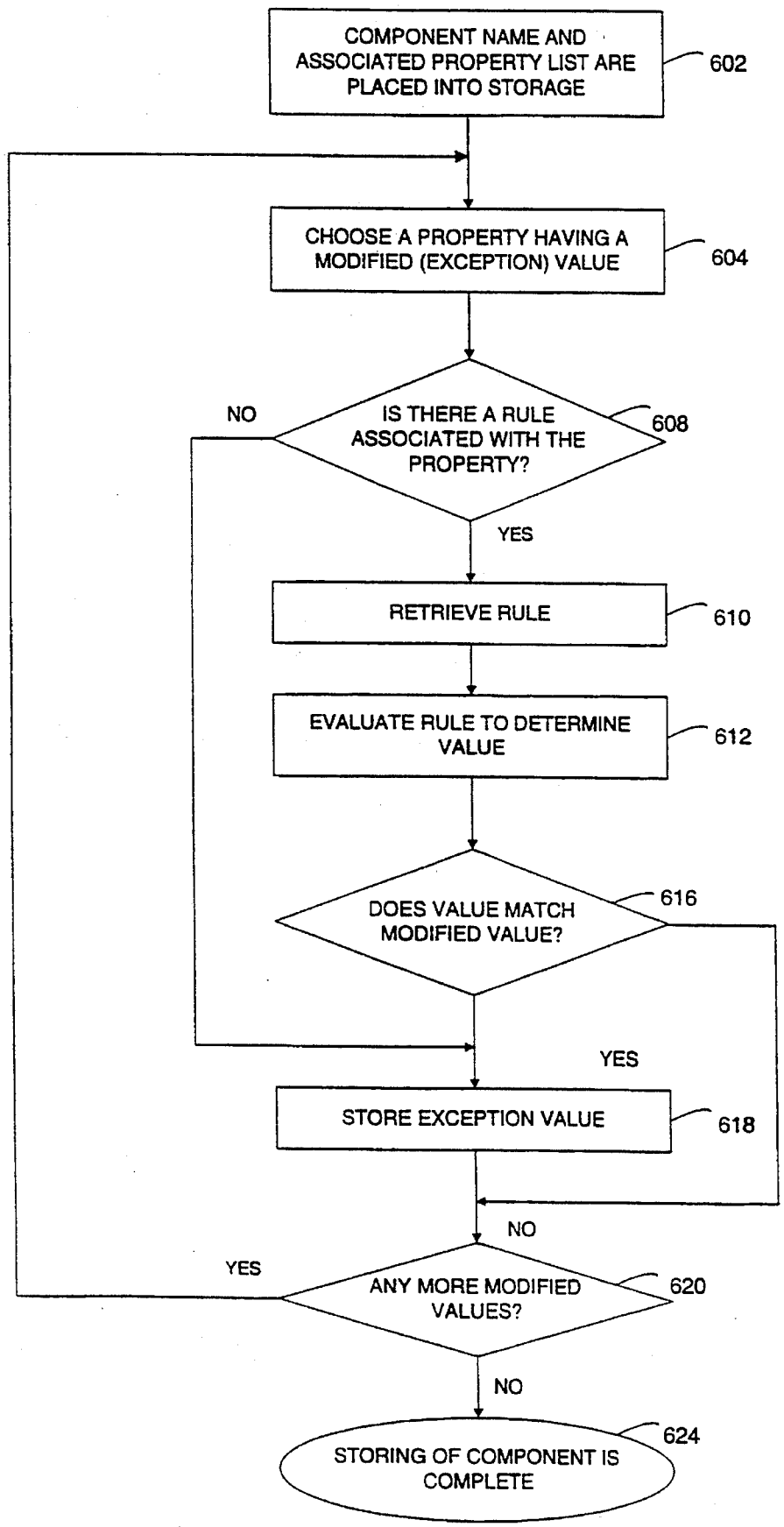
FIG. 6 is a flow diagram showing a technique for storing component models according to a preferred embodiment of the invention.
Figure 7:
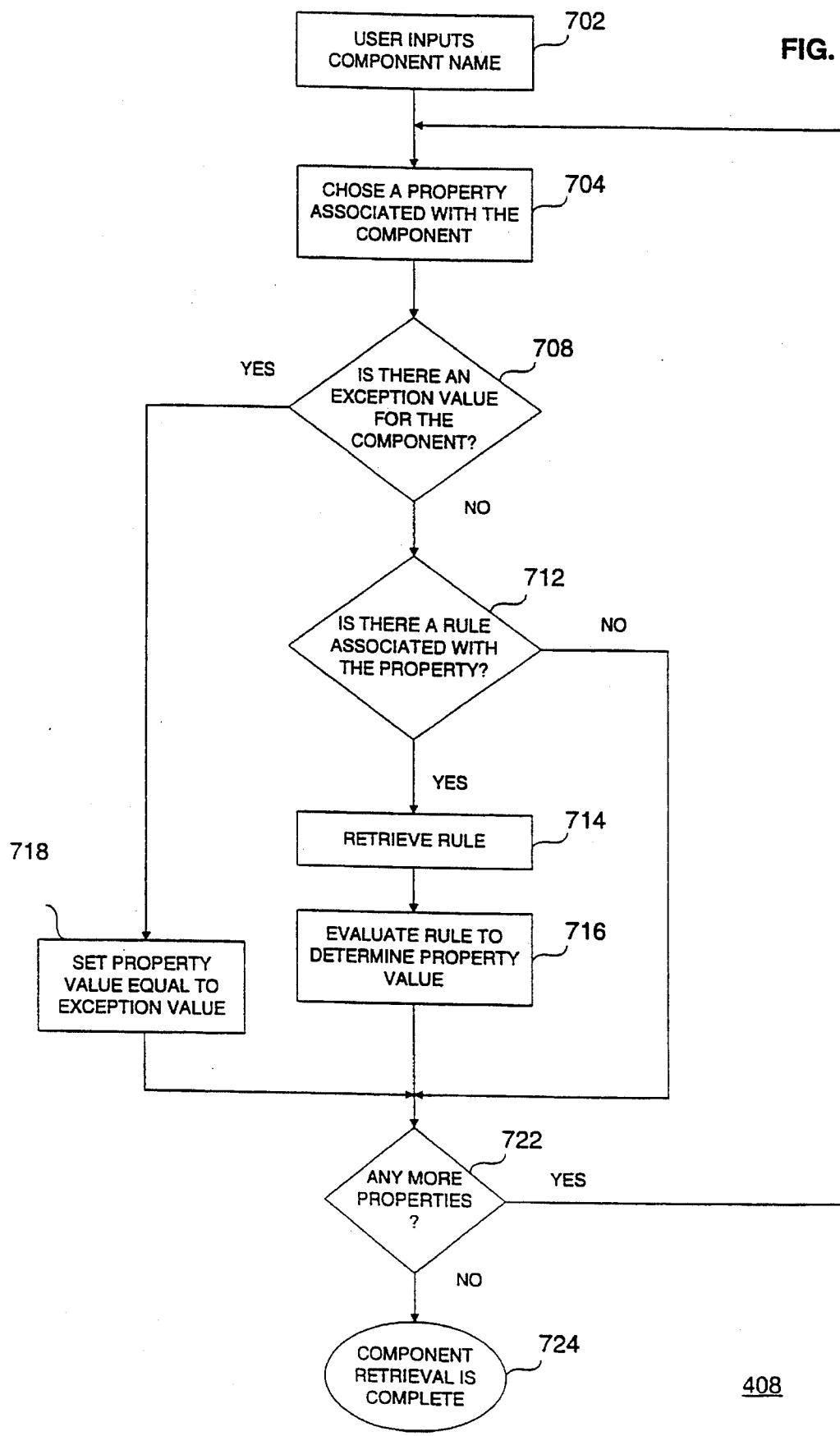
FIG. 7 is a flow diagram showing a technique for retrieving component models according to a preferred embodiment of the invention.

Another significant feature of the present invention is the ability to efficiently store component models 211 in the hard disk storage 204. FIG. 6 is a flow diagram showing a technique for storing component models, 406, according to a preferred embodiment of the invention. The component/exception storing module (CESM) 302 receives a component model that includes a component name and one or more exception values. The CESM 302 stores, 602, the component name (identifier) and a pointer to a list or sub-list of properties associated with the component model at an available memory location in the hard disk storage 204. The CESM 302 repeats steps 640–620, as described below, for each exception value associated with the component model to ensure that an exception value that could be derived from a rule is not stored in the hard disk storage 204, i.e., to prevent storing redundant property values. The CESM 302 selects, 604, a property having an exception value. Using the rule input/output module 304 the CESM 302 determines if any rules are associated with the property. If no rules are associated with the property, the CESM 302 stores, 618, the exception value. The CESM 302 repeats steps 640–620 if it determines, 620, that additional properties having an exception value exist for the component model being stored.

If the CESM 302 determines, 608, that one or more rules are associated with the property the rule(s) are retrieved, 610, by the rule input/output module 304. The rule evaluator 308 determines, 612, the rule-based value for the property, as set forth above. If the rule-based value is equivalent to the exception value, as determined by the CESM 302 in step 616, the CESM 302 does not store the exception value because, to do so, results in storing redundant data in the hard disk storage 204. Redundant data is data that can be derived by both a rule and by an exception value. By ensuring that no redundant data is stored in the hard disk storage 204, the memory requirements for each component model is significantly reduced. If the CESM 302 determines that the rule-based value is not significantly equivalent to the exception value, the CESM 302 stores, 618, the exception value in the hard disk storage 204. The system tolerance with respect to when two property values are "equivalent" is previously defined by a user. Normally, two property values are equivalent only if they are exactly equal, however the user may define broaden the definition to accommodate minor differences in property values. The CESM repeats steps 640–620 if it determines, 620, that additional properties having an exception value exist for the component model being stored. When the CESM 302 tests all exception values associated with the component model, the storing of the component model is complete 624.

After storing, 406, a component model, the component model generator 200 can retrieve, 408, the component model. The technique for retrieving a component model according to a preferred embodiment of the invention is now described with reference to FIG. 7. The user inputs, 702, a component model name using the GUI 220. The component/exception retrieving module (CERM) 306 receives a model name. The model name identifies a component model to be retrieved. If the received component name does not exist, the component model generator 200 either notifies the user that a different name must be entered or the user is given the option to define a new component associated with the received name. If a preexisting name is received, the CERM 306 receives from the hard disk storage 204 a list or sublist of properties that is associated with the component model. The CERM 306 also receives the exception values associated with the component model that were stored, 406, by the CESM 302. The CERM 306 repeats steps 704–722 for each property associated with the component.

The CERM 306 selects a property associated with a component model. The CERM 306 determines, 708, whether the selected property has an exception value. If the selected property does have an exception value, the CERM 306 sets, 718, the property value equal to the exception value for the selected property. Steps 704–722 are repeated for each property associated with the component model.

If the selected property does not have an exception value the CERM 306 determines, 712, if there is a rule associated with the selected property. If no rules are associated with he property the property value for the component model is a null value, i.e., the value is unimportant or unknown to the user who defines, 404, the component model. If one or more rules are associated with the property, the rule input/output module 304 retrieves the rules, 714. The rule evaluator 308 determines, 716, the associated property value by applying the rule to the remaining property values of the component model. After the CERM 306 determines a value for the chosen property, e.g., an exception value, a rule-based property value or a null value, the CERM 306 repeats steps 704–722 until all properties associated with the component model have been selected. After the CERM 306 determines, 722, that all the properties associated with the component model have been selected, the component model retrieval is complete 724.

The system and method of the invention enables a component model generator to create, store, and retrieve more efficient component models. The invention reduces the amount of storage required to store a component model by using rules and exception values. The invention achieves a significant reduction in storage requirements while maintaining the integrity of the system by storing all component information, albeit in a different form from previous systems.

Another benefit of the present invention is that when defining or editing component models, 404, the rules enable the component definition module 310 to automatically generate many property values that otherwise must be manually entered. This feature reduces the time necessary to create and maintain a component model library. In addition, this feature increases the reliability of the component model library. The probability of data entry errors decreases by reducing the amount of data that must be input by a user. As a result the library is more accurate and reliable.

What is claimed is:

1. A method for storing and generating a first electrical component representation using a digital computer, representing a first physical electrical component, the method comprising the steps of:

forming in the digital computer the first electrical component representation having a first value and a second value respectively representative of a first property and a second property of the first electrical component representation;

generating a relationship between said first property and said second property, which defines said second value based upon said first value;

storing the first electrical component representation by storing said relationship and said first value;

generating the first electrical component representation by retrieving said first value and said relationship and generating said second value by applying said relationship to said first value.

2. A computer program embodied in a tangible medium and capable of being read by a computer, for performing the method of claim 1.

3. The method of claim 1, further comprising the steps of:

forming, in the digital computer, a second electrical component representation having an exception value;

storing said second electrical component representation by storing said exception value.

4. The method of claim 3, further comprising the steps of:

forming, in the digital computer, a second electrical component representation having said first value and an exception value representative of said first property and said second property respectively, wherein said exception value is not equivalent to said second value; and storing said second electrical component representation by storing said first value and said exception value.

5. The method of claim 4, wherein the step of forming said second electrical component representation includes determining that said exception value is not equivalent to said second value by generating said second value from said relationship and said first value, and comparing said second value to said exception value.

6. The method of claim 4, further comprising the step of:

generating said second electrical component representation by retrieving said first value and said exception value from storage.

7. The method of claim 1, further comprising the steps of:

forming in the digital computer a second electrical component representation, representing a second physical electrical component, having said first value and said second value respectively representative of said first property and said second property, of said second electrical component representation; and storing said second electrical component representation by storing said first value.

8. A system for storing a first electrical component representation comprising:

a processor;

a storage device coupled to said processor;

component defining means, disposed to receive a signal from said storage device, for generating signals indicative of a first value and a second value, respectively representative of a first property and a second property associated with the first electrical component representation, representing a first physical electrical component;

relationship generating means, coupled to said storage device, for generating a signal representative of a relationship between said first property and said second property, wherein said relationship signal defines said second value signal based upon said first value signal; and storing means, coupled to said processor, for storing said first value signal and said relationship signal in said storage means to fully describe said first property and said second property of said first physical electrical component.

9. The system of claim 8, further comprising:

relationship application means, coupled to said component defining means, for applying said relationship signal to said first value signal to generate said second value signal.

10. The system of claim 9, further comprising:

component retrieving means, coupled to said storage device, for generating a signal representative of the first electrical component representation by retrieving said first value signal and said relationship signal and generating said second value signal by applying said relationship signal to said first value signal.

11. The system of claim 10, further comprising:

rule retrieving means, coupled to said memory device, for retrieving said relationship signal from said memory device.

12. A method for storing and generating a plurality of physical electrical component representations using a digital computer, comprising the steps of:

forming in the digital computer a first physical electrical component representation having a first value and a second value respectively representative of a first property and a second property of the first electrical component representation;

generating a relationship between said first property and said second property, which defines said second value based upon said first value;

storing the first electrical component representation by storing said relationship and said first value;

generating the first electrical component representation by retrieving said first value and said relationship and generating said second value by applying said relationship to said first value;

forming, in the digital computer, a second electrical component representation having said first value and an exception value representative of said first property and said second property respectively, wherein said exception value is not equivalent to said second value; and storing said second electrical component representation by storing said first value and said exception value.

* * * * *